(12) United States Patent
Girardot et al.

(10) Patent No.: US 6,883,137 B1
(45) Date of Patent: Apr. 19, 2005

(54) SYSTEM AND METHOD FOR SCHEMA-DRIVEN COMPRESSION OF EXTENSIBLE MARK-UP LANGUAGE (XML) DOCUMENTS

(75) Inventors: Marc Georges Girardot, Paris (FR); Neelakantan Sundaresan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/551,402

(22) Filed: Apr. 17, 2000

(51) Int. Cl.[7] ............... G06F 15/00; G06F 17/00; G06F 17/21; G06F 17/24; H04K 1/00
(52) U.S. Cl. ............ 715/513; 715/523; 715/531; 715/514; 715/515; 715/530; 710/68; 380/269
(58) Field of Search .................. 715/513, 523

(56) References Cited

U.S. PATENT DOCUMENTS

| | | | |
|---|---|---|---|
| 6,230,171 B1 * | 5/2001 | Pacifici et al. ............... | 715/512 |
| 6,330,574 B1 * | 12/2001 | Murashita ................... | 715/513 |
| 6,397,259 B1 * | 5/2002 | Lincke et al. ............... | 709/236 |
| 2001/0016068 A1 * | 8/2001 | Shibata ....................... | 382/195 |
| 2001/0042081 A1 * | 11/2001 | MacFarlane et al. ........ | 707/513 |

OTHER PUBLICATIONS

Liefke, Hartmut; Suciu, Dan; "An Efficient Compressor for XML"; Aug. 24, 1999; AT&T Research Labs, Floram Park; 38 slides.*
Liefke, Hartmut; Suciu, Dan; "An Extensible Compressor for XML Data"; Mar. 2000; SIGMOD Record, vol. 29, No. 1; pp. 57–62.*
W3C, Extensible Markup Language (XML) 1.0, W3C Recommendation Feb. 10, 1998.*
W3C, "WAP Binary XML Content Format", W3C Note Jun. 24, 1999, Wireless Application Forum, Ltd.*

* cited by examiner

*Primary Examiner*—Joseph Feild
*Assistant Examiner*—Nathan Hillery
(74) *Attorney, Agent, or Firm*—Mark McCabe, Esq.; McGinn & Gibb, PLLC

(57) ABSTRACT

A method (and system) for compressing an extensible markup language (XML) document, includes compressing an XML document such that information in a markup portion therein is maintained in a compressed form to allow the document to be reconstructed. During the compressing, the markup portion and a non-markup portion of the document are separated, and the non-markup component is compressed using a first compression method and the markup component is compressed using a second compression method.

42 Claims, 8 Drawing Sheets

```
┌──────────────────────────────────────┐
│ SERVER CREATES DATA STRUCTURES (HASH TABLES) │─310
│      FOR THE SERVER CODE SPACES.     │
└──────────────────┬───────────────────┘
                   ▼
┌──────────────────────────────────────┐
│         SERVER PARSES THE DTD.       │─320
└──────────────────┬───────────────────┘
                   ▼
┌──────────────────────────────────────┐
│      SERVER FILLS IN HIS CODE SPACES.│─330
└──────────────────┬───────────────────┘
                   ▼
┌──────────────────────────────────────┐
│ CLIENT CREATES DATA STRUCTURES (ARRAYS) │─340
│      FOR THE CLIENT CODE SPACES.     │
└──────────────────┬───────────────────┘
                   ▼
┌──────────────────────────────────────┐
│         CLIENT PARSES THE DTD.       │─350
└──────────────────┬───────────────────┘
                   ▼
┌──────────────────────────────────────┐
│      CLIENT FILLS IN HIS CODE SPACES.│─360
└──────────────────────────────────────┘
```

FIG.3A

| TAG CODE SPACE | | ATTRIBUTE NAME CODE SPACE | | ATTRIBUTE NAME CODE SPACE | |
|---|---|---|---|---|---|
| TAG NAME | TOKEN | ATTRIBUTE NAME | TOKEN | ATTRIBUTE VALUE | TOKEN |
| BOOK | 5 | AUTHOR | 5 | LITERATURE | 5 |
| TITLE | 6 | GENRE | 6 | SCIENCE | 6 |
| CHAPTER | 7 | NUMBER | 7 | HISTORY | 7 |
| PICTURE | 8 | CAPTION | 8 | CARTOONS | 8 |

HASH TABLE FOR THE CODE SPACES ON THE SERVER SIDE

FIG.3B

CODE SPACE ARRAY

| index \ page | 0 | 1 | 2 | 3 | 4 |
|---|---|---|---|---|---|
| 5 | abbrev | code1 | doctitle | glentry | index |
| 6 | abstract | codeno | dt | glossary | iref |
| 7 | address | codetext | dthd | group | kwd |
| 8 | annot | compl | epsc | grplbl | l |
| 9 | apl | coprext | erev | grpsep | label |
| 10 | appendix | copmote | f | gt | lblbody |
| 11 | artalt | cover | fig | h0 | lblbox |
| 12 | artdef | ct | figbody | h1 | ldesc |
| 13 | artwork | danger | figcap | h2 | le |
| 14 | asmlist | dataobj | fugdef | h3 | ledesc |
| 15 | author | date | figdesc | h4 | ledi |
| 16 | autolink | dd | figlist | h5 | legend |
| 17 | backm | ddhd | figref | h6 | len |
| 18 | bibliog | delim | figseg | hd | lename |
| 19 | bin | dest | filenum | hdref | lers |
| 20 | bindnum | df | fle | hex | lersdef |
| 21 | body | dfdef | fn | hp0 | li |
| 22 | c | dialdef | fnref | hp1 | library |
| 23 | cause | dialog | fragment | hp2 | lines |
| 24 | caution | dirdef | fragref | hp3 | link |
| 25 | cgdef | divbody | frontm | hp4 | liref |
| 26 | cgraphic | dl | ft | i1 | lp |
| 27 | char | dldef | gd | i2 | lq |
| 28 | ci | dlentry | gdg | i3 | map |
| 29 | cit | docdesc | gendtitle | ih1 | mapqfix |
| 30 | cmt | docnum | gl | ih2 | mcdef |
| 31 | code | docprof | gldef | ih3 | mcdi |

FIG.3C

SYSTEM AND METHOD FOR SCHEMA-DRIVEN COMPRESSION OF EXTENSIBLE MARK-UP LANGUAGE (XML) DOCUMENTS

BACKGROUND OF THE INVENTION

1. Field of the Invention

The present invention relates to an efficient compression algorithm for XML (extensible mark-up language) documents, and more particularly to a computer system, method and computer-readable code for schema-driven compression of extensible mark-up language (XML) documents.

2. Description of the Related Art

The Binary XML Content Format Specification (e.g., WBXML which is an acronym for wireless application protocol binary XML) defines a compact binary representation of the Extensible Markup Language (XML). ("XML" is a trademark of Massachusetts Institute of Technology.) The binary XML content format is designed to reduce the transmission size of XML documents with no loss of functionality or semantic information.

For example, it preserves the element structure of XML, allowing a browser to skip unknown elements or attributes. More specifically, it encodes the tag names and the attributes names and values with tokens (e.g., a token may be a single byte). Tokens (e.g., application tokens) are split into a set of overlapping code spaces. A particular token's meaning is dependent on the context in which it is used. Tokens are organized in the following manner. That is, there are two classifications of tokens: global tokens and application tokens.

Global tokens are assigned a fixed set of codes in all contexts and are unambiguous in all situations. Global codes are used to encode inline data (e.g., strings, entitles, opaque data, etc.) and to encode a variety of miscellaneous control functions.

Application tokens have a context-dependent meaning and are split into two overlapping code spaces. These two code spaces are the tag code space and the attribute code space. A given token value (e.g., 0x99 representing a hexadecimal value; the decimal value corresponding to the hexadecimal value 0x99 is 153) will have a different meaning depending on whether it represents a token in the tag or attribute code space. The tag code space represents specific tag names. Each tag token is a single-byte code and represents a specific tag name (e.g., CARD).

The attribute code space is split into two numeric ranges representing attribute prefixes and attribute values respectively.

Each code space (e.g., for both tag and attribute code space) is further split into a series of 256 code pages. Code pages allow for future expansion of the well-known codes. A single token (e.g., SWITCH_PAGE) switches between the code pages. The definition of tag and attribute codes is document-type-specific. Global codes are divided between a generic set of codes common to all document types and a set reserved for document-type specific extensions.

Huffmann and Lempel Ziv (LZ77 and LZ78) algorithms ZLIB (Zip LIBrary) and GZIP (GNU (GNU's Not Unix) ZIP) are two implementations of these algorithms) are known for text data. However, as XML documents are compressed, the structural information is not necessarily maintained in the compressed form so that the documents cannot be easily reconstructed. Moreover, in applying these algorithms, some (if not all) structural information cannot be retrieved without prior decompression because the compressed stream in a flat byte stream.

Further, hitherto the present invention, separating markup (e.g., structure such as element names and attribute names and values) and non-markup (data), and compressing the non-markup component using ZLIB and the markup component using binary coding has not been performed.

Further, a binary encoding component which would retain the structure occupies approximately twice as much space as the ZLIB equivalent that loses structure. This is problematic so that there must be a tradeoff between compressing the structure component with a higher compression rate and retaining the structure.

That is, the exemplary data compression algorithms (Huffman, LZ77, LZ78, Millau (the inventive algorithm)) are lossless but traditional algorithms (Huffman, LZ) need prior decompression (a time costly operation) to retrieve the structure, whereas the inventive format does not need decompression to retrieve the structure encoded in binary format. Thus, prior to the invention, a tradeoff was required between compression rate and decompression time.

Further, the conventional methods perform poorly on relatively small documents (like eBusiness transactions) because they are designed to take advantage of the redundancy of the information which is not significant in small documents. They were not designed to take advantage of the structure. In contrast, as described below, the present invention is designed to take advantage of the structure described in the Document Type Definition (DTD) so it performs well on small documents as well as large documents.

SUMMARY OF THE INVENTION

In view of the foregoing and other problems, disadvantages, and drawbacks of the conventional methods and structures, an object of the present invention is to provide a method and system for providing an efficient compression algorithm for XML documents.

Another object of the present invention is to provide a method and system for building code spaces from information provided by a Document Type Definition (DTD) of an XML document.

In a first aspect of the present invention, a method of compressing an extensible markup language (XML) document, includes compressing an XML document such that the structural information is maintained in a compressed form to allow the document to be reconstructed. During this compression, a markup portion and a non-markup portion of the document are separated, and the non-markup component is compressed using a first compression method (e.g., preferably ZLIB or GZIP) and the markup component is compressed using a second compression method.

In a second aspect of the present invention, a method of compressing an XML document, includes creating the data structure on the server and on the client, parsing the document type definition (DTD) of the XML document, filling in the server code spaces, and filling in the client code spaces.

Hence, the present invention not only takes advantage of the separation of the structure and data of an XML document, but it also takes advantage of the associated DTD (schema) of the document to perform optimization. The DTD schema describes the constraints on the structures, possible values, and occurrence restrictions of attribute values and elements. The compression algorithm, once it knows that there is a schema associated with the document, takes advantage of this and produces further compression of the data.

Further, the present invention provides an efficient compression algorithm for XML documents in which the XML documents are compressed, and such that the structural information will be kept in the compressed form so that the documents can be easily reconstructed. The invention provides a lossless compression algorithm that gets as close as possible to the ZLIB algorithm. Hence, with the invention, the markup (structure) and non-markup (data) can be separated, and the non-markup component can be compressed using ZLIB and the markup component can be compressed using binary encoding.

Thus, with the unique and unobvious aspects of the present invention, the schema information (the DTD associated with the document) can be used to compress the structure component and obtain higher compression rate while simultaneously retaining the structure.

Further, the method and system of the present invention provide better compression rates for small documents (like eBusiness transactions) than GZIP and other conventional schemes.

BRIEF DESCRIPTION OF THE DRAWINGS

The foregoing and other purposes, aspects and advantages will be better understood from the following detailed description of a preferred embodiment of the invention with reference to the drawings, in which:

FIG. 3A illustrates a flowchart for a method 300 of compression according to the present invention;

FIG. 3B illustrates an exemplary hash table for use with the invention;

FIG. 3C illustrates an exemplary code space array for use with the invention;

DETAILED DESCRIPTION OF PREFERRED EMBODIMENTS OF THE INVENTION

Figure 1:
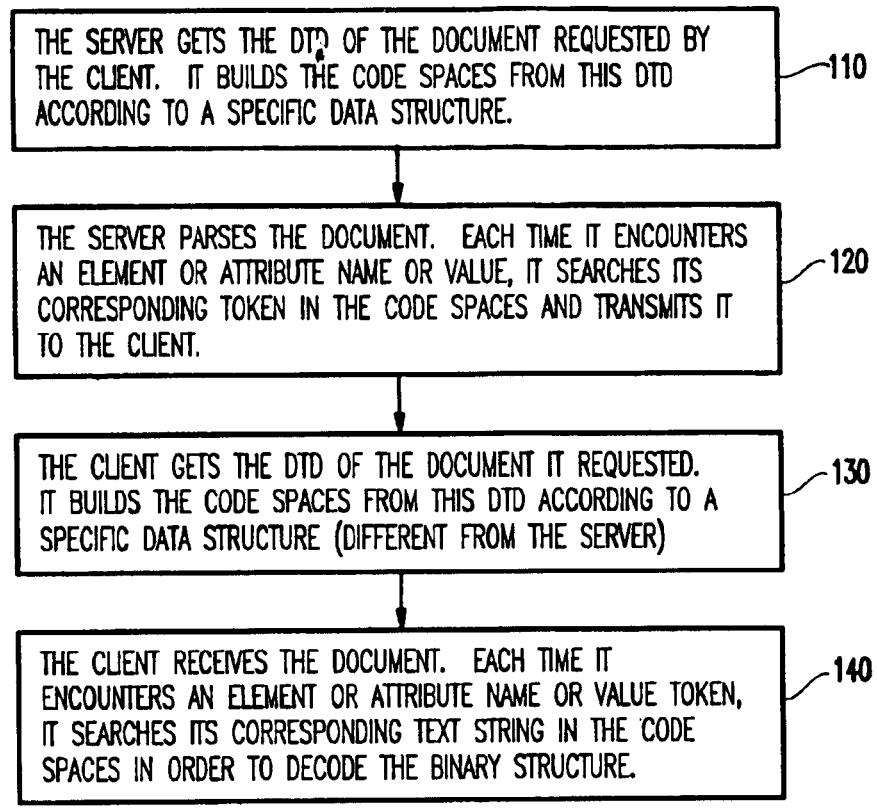
FIG. 1 illustrates a flowchart for the method according to the present invention.

Referring now to the drawings, and more particularly to FIGS. 1–9, there are shown preferred embodiments of the method and structures according to the present invention.

Generally, the invention provides an efficient compression algorithm for XML documents.

As mentioned above, ZLIB algorithms are known for text data. As XML documents are compressed, the structural information will be kept in the compressed form so that the documents can be easily reconstructed. However, such compression and reconstruction in inefficient. Given that the lower bound on the compression size is what can be obtained by applying ZLIB where ZLIB loses all structural information, the invention provides a lossless compression algorithm that gets as close as possible to ZLIB.

With the invention, it is possible to separate markup (structure) and non-markup (data), and compress the non-markup component using ZLIB and the markup component using binary encoding. It is noted that binary encoding is described in the WAP Binary XML Content Format Specification, W3C Note, 24 Jun. 1999. The present invention has added enhancements to be able to separate content from structure and link them together. More specifically, the invention provides information in the structure stream to retrieve data from the content stream.

Further, the binary encoding component which retains the structure occupies approximately twice as much space (e.g., in the worst case but it can be smaller for small documents) as the ZLIB equivalent that loses structure. However, this is not truly a drawback because the structure stream is usually small compared to the data stream. Moreover, it can be compressed using a traditional compression algorithm, thus achieving better compression rate than with the traditional algorithm alone. In the invention, the schema information (the DTD associated with the document) can be used to compress the structure component and obtain higher compression rate while simultaneously retaining the structure.

An XML document primarily is formed of a strictly nested hierarchy of elements with a single root. In the context of the present application, "strictly nested" means that an XML document can be represented as a tree. Elements can contain character data, child elements, or a mixture of both. In addition, the elements may have attributes (e.g., characteristics or properties). Child character data and child elements are strictly ordered (e.g., if element A is defined in the DTD with children B, C and D in this order, then chidden B, C and D must appear in this order in the XML document) whereas attributes are not. For example, consider:

<?xml version="1.0"?>
<Book Author="John Steinbeck" Genre="literature">
<Title>Of Mice and Men</Title>
<Chapter id="1">
Blah . . . Blah . . .
<Chapter id="2">
Blah . . . Blah . . .
</Chapter>
</Book>

The names of the elements and attributes and their order in the hierarchy (among other things) form the XML markup language used by the document. This language can be defined by the document author or it can be inferred from the document's structure. In the example shown above, the language contains three elements: Book, Title, and Chapter. The Book element contains a single Title element and one or more Chapter elements. The Book element has an Author attribute and a Genre attribute and the Chapter element has an id attribute (e.g., "2").

An important reason to explicitly define the language is so that documents can be checked (e.g., both before and after compression because the inventive format retains the structure) to determine whether the documents conform to the language (e.g., such as XML). For example, if a grammar for the Book language was defined, authors using this grammar could use a validating parser to ensure that their documents conformed to the language.

An XML markup language is defined in a Document Type Definition (DTD). The DTD is either contained in a <!DOCTYPE> tag, contained in an external file and referenced from a <!DOCTYPE> tag, or both. For example, the document shown above could contain the following <!DOCTYPE> tag:

```
<!DOCTYPE Book [
<!ELEMENT Book (Title, Chapter+)>
<!ATTLIST Book Author CDATA #REQUIRED
    Genre (literature|science|history) #REQUIRED>
<!ELEMENT Title (#PCDATA)>
<!ELEMENT Chapter (#PCDATA)>
<!ATTLIST Chapter id ID #REQUIRED>
]>
```

An element is defined as a group of one or more subelements/subgroups, character data, EMPTY, or ANY. For example:

```
Group:
    <!ELEMENT A (B,C)>
Character data:
    <!ELEMENT A (#PCDATA)>
EMPTY:
    <!ELEMFNT A EMPTY>
ANY:
    <!ELEMENT A ANY>
```

Elements can have zero or more attributes. For example:

<!ELEMENT A (#PCDATA)>

<!--Declare an attribute a for element A-->

<!ATTLIST A a CDATA #IMPLIED>

Attributes can be optional, required, or have a fixed value. Optional attributes may have a default, but fixed attributes must have a default. For example:

Optional without a default:

<!--Element A has an attribute a. #IMPLIED="optional, no default"-->

<!ATTLIST A a CDATA #IMPLIED>

Optional with a default:

<!If attribute a is not provided, a default of "aaa" will be used. - - >

<!ATTLIST A a CDATA "aaa">

Required:

<!ATTLIST A a CDATA #REQUIRED>

Fixed:

<!--The value of attribute a is always "aaa"-->

<!ATTLIST A a CDATA #FIXED "aaa">

Each attribute has a type:

Character data:

<!ATTLIST A a CDATA #IMPLIED>

A user-defined enumerated type

<!--Attribute a uses a simple enumeration.-->

<!ATTLIST A a (yes/no)#IMPLIED>

<!--Attribute a uses an enumeration of notation types. See the XML specification for complete details.-->

<ATTLIST A a NOTATION (ps|pdf) #IMPLIED>

ID, IDREF: These attributes point from one element to another. The value of the IDREF attribute on the pointing element is the same as the value of the ID attribute on the pointed-to element. For example, consider:

<!--Attribute id gives the ID of element A-->

<!ATTLIST A id ID #IMPLIED>

<!--Attribute ref points to the ID of another element-->

<!ATTLIST A ref IDREF #IMPLIED>

ENTITY, ENTITIES: These attributes point to external data in the form of unparsed entities. For complete details, see the XML specification (e.g., see Extensible Markup Language (XML) 1.0 Specification, W3C Recommendation, 10 Feb. 1998).

<!--Attribute a points to a single unparsed entity-->

<'ATTLIST A a New Entity #IMPLIED>

<!--Attribute b points to multiple unparsed entities-->

<!ATTLIST A b ENTITIES #IMPLIED>

NMTOKEN, NMTOKENS. These attributes have single/multiple tokens as values.

<!ATTLIST A a NMTOKEN #IMPLIED>

<ATTLIST A b NMTOKENS #IMPLIED>

The DTD specifies constraints on the structure and the type of XML documents. Hence, given a DTD, it is possible to know that the document will follow certain constraints on structure and types. This can be used to further compact (e.g., compress) the representation of the XML structure in the binary form (e.g., binary encoding).

The Method of the Invention

Compression

Referring now to FIG. 1, first a flow diagram of a method 100 according to the invention is provided which shows how code spaces are used to compress an XML structure.

First, in step 110, the server gets the DTD of the document requested by the client. It builds the code spaces from this DTD according to a specific data structure.

Then, in step 120, the server parses the document. Each time it encounters an element or attribute name or value, it searches its corresponding token in the code spaces and transmits it to the client.

In step 130, the client gets the DTD of the document if requested. It builds the code spaces from this DTD according to a specific data structure (e.g., different from the server).

In step 140, the client receives the document. Each time it encounters an element or attribute name or value token, it searches its corresponding text string in the code spaces in order to decode the binary structure.

Figure 2:
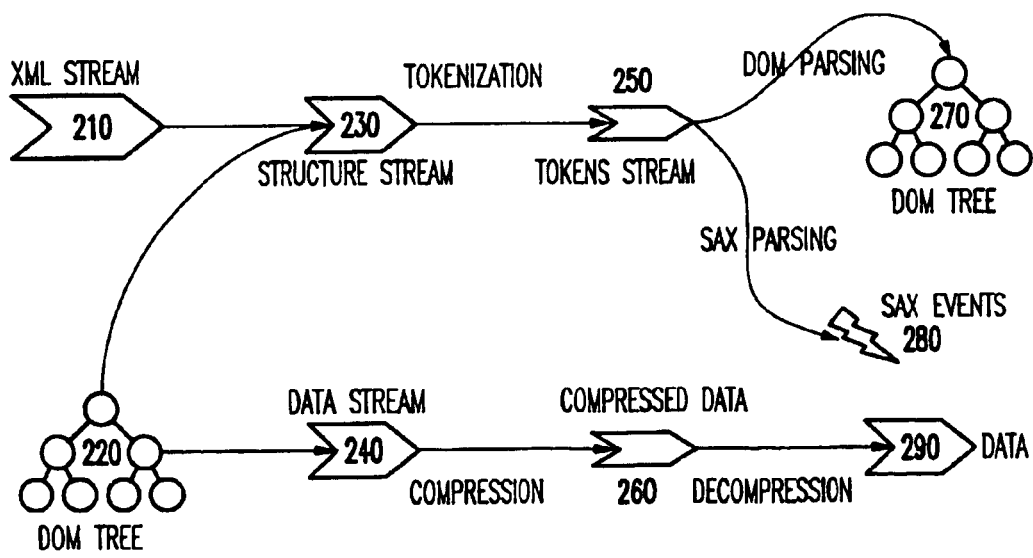
FIG. 2 illustrates a schematic block diagram of a system for implementing the present invention.
Figure 4:
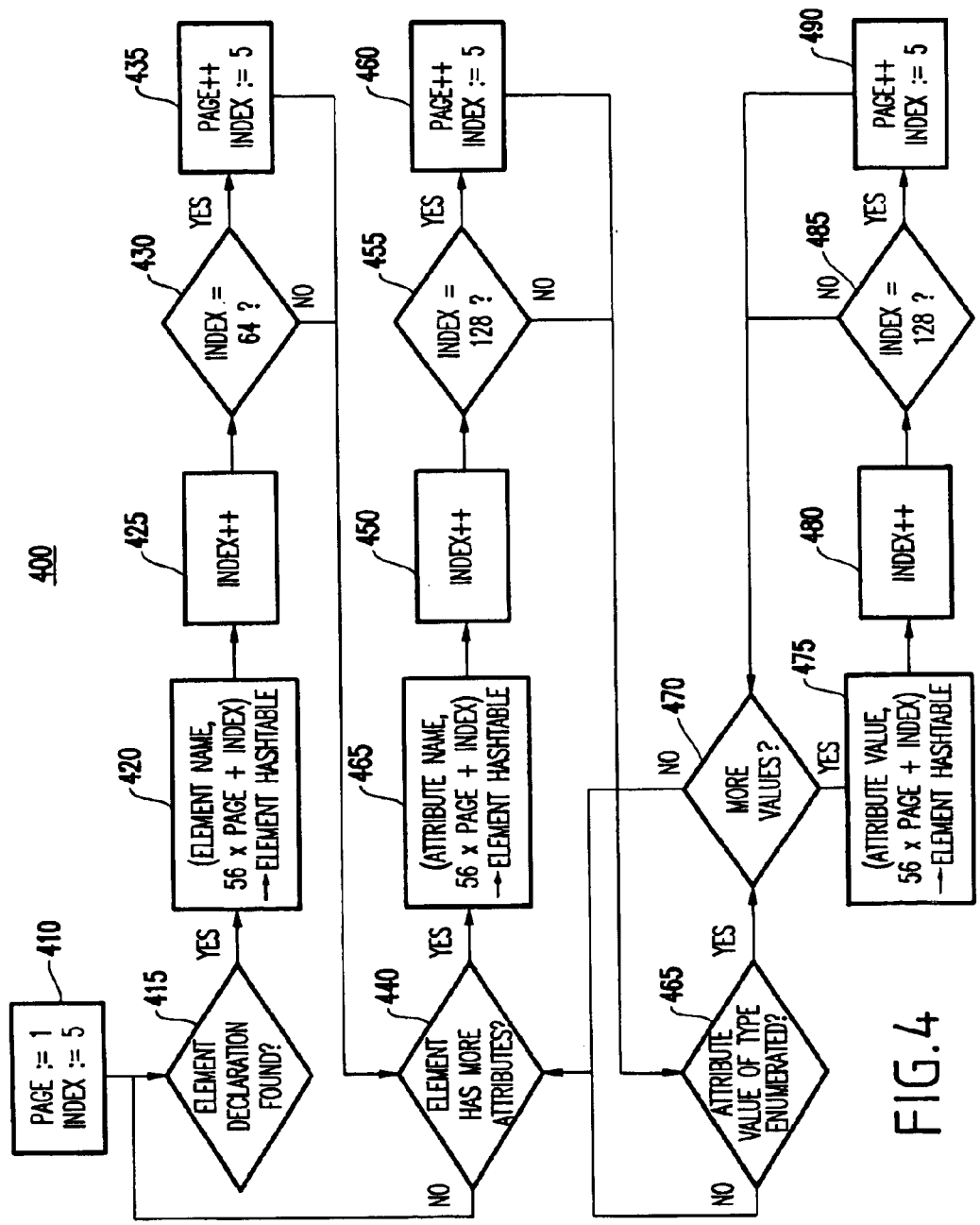
FIG. 4 illustrates a flowchart of the operation 400 of step 330 of the compression method 300 according to the present invention.
Figure 5:
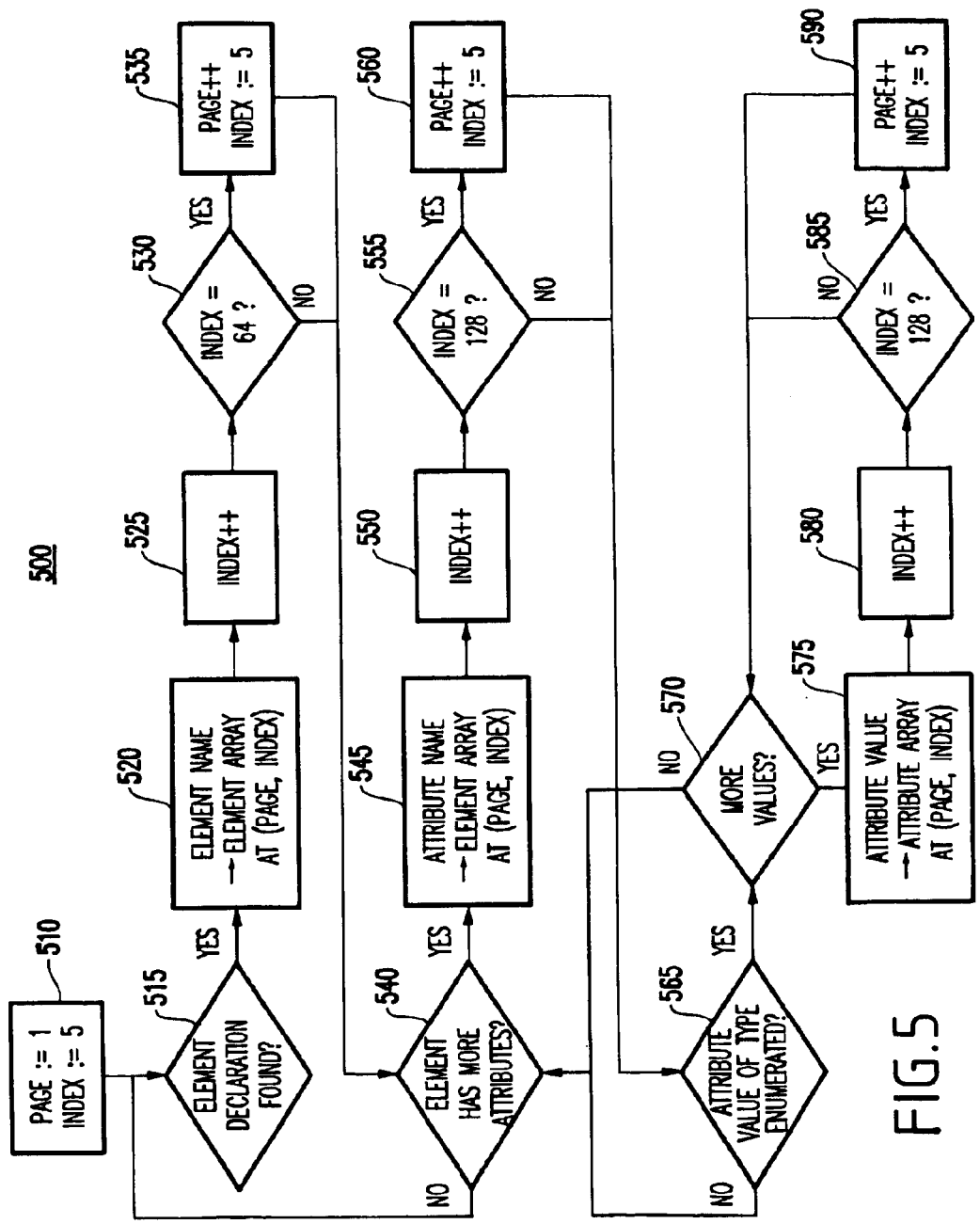
FIG. 5 illustrates a method 500 of filling in a two-dimension array for an element code space according to the present invention.

FIG. 2 illustrates a functional system block diagram for implementing the invention.

More specifically, the input can be either an XML stream 210 or a Document Object Model (DOM®) tree 220. If it is an XML stream, this stream is spliced into two substreams, a structure stream 230 and a data stream 240. Similarly, if the input is a DOM® tree ("DOM" is a registered trademark of Massachusetts Institute of Technology), the system can produce two streams from this DOM® tress (e.g., a structure stream 230 and a data stream 240).

"DOM" is an acronym for "Document Object Model", which is a language-independent application programming interface ("API") for use with documents specified in markup languages including XML. DOM is published as a Recommendation of the World Wide Web Consortium, entitled "Document Object Model (DOM) Level 1 Specification, Version 1.0" (1998) and available on the World Wide Web at http://www.w3.org/TR/REC-DOM-Level-1.

"DOM tree" refers to the logical structure with which a document is modeled using the DOM. A DOM tree is a hierarchical representation of the document structure and contents. Each DOM tree has a root node and one or more leaf nodes, with zero or more intermediate nodes, using the terminology for tree structures that is commonly known in the computer programming art. A node's predecessor node in the tree is called a "parent" and nodes below a given node in the tree are called "child" nodes.

The DOM API enables application programs to access this tree-oriented abstraction of a document, and to manipulate document structure and contents (that is, by changing, deleting, and/or adding elements). Further, the DOM enables navigating the structure of the document.

To reduce the size of the structure stream without losing any information, the system encodes the structure in WBXML format. This process generates a WBXML stream 250 that is smaller (about 80% smaller) than the initial structure stream 230. Similarly, the data stream 240 is compressed using a conventional compression algorithm (e.g., GZIP). This produces a smaller stream called compressed data stream 260. In an efficient embodiment of the present invention, the two first steps can be realized at the same time (e.g., performed in parallel).

The decoding can produce two outputs according to the needs of the application. That is, the system can generate a SAX event 270 for each received element. Possibly, it can create an XML stream from these SAX events. The system can also build dynamically a DOM tree 280. Each time an element is received, it is added dynamically to the DOM tree.

The decompression of the data is done using the conventional decompression algorithm corresponding to the algorithm used for the compression. It produces a data stream 290. Then, this data can be incorporated in the DOM tree or can be used to generate SAX characters events. In an efficient embodiment of the present invention, these steps can be realized at the same time (e.g., in parallel).

Turning now to the flow diagram in FIG. 3A, the primary steps of a method 300 of the present invention will be described. These steps include creating the data structure on the server and on the client, parsing the DTD, filling in the server code spacers, and filling in the client code spaces.

In step 310, the data structure on the server is created. In step 340, the data structure on the client is created. That is, the data structure on the server and on the client are described respectively.

On the server side, for a specific tag name or attribute name or value (e.g., which are of string type), the server must find the corresponding token. Thus, the server must be able to quickly find a string in a table. Hence, in an exemplary embodiment, a Hash table may be used (e.g., see FIG. 3B for an exemplary hash table) where the keys are the strings and the value are the corresponding tokens.

On the client side, the client must find the tag name or attribute name or value corresponding to a specific token. More specifically, given a page number and an index in a code space page, it must find the corresponding string. The preferred data structure here is for each code space to have a two-dimensional array indexed by page numbers and indexes in pages (e.g., see FIG. 3C).

Then, in step 320, the DTD is parsed on the server and, in step 350, on the client. Preferably, the DTD is parsed using IBm XML Parser for JAVA® 1.1.16 which generates a tree structure for the DTD. JAVA® is a trademark of Sun Microsystems, Inc. (Parsing a DTD with IBM XML Parser for Java produces a tree where elements and attributes can be accessed by name.) It allows accessing elements declarations and attributes declarations with name and type and also attributes values when attribute type is enumerated. For example, method getElementDeclarations returns an enumeration of all element declarations in this DTD, getContentModel(elementName) returns the content model for the specified element name in this DTD, getAttributeDeclaratons(elementName) returns an enumeration of all attribute list declarations for the specified element name in this DTD.

In step 330, the server code spaces are filled-in. This step is described in further detail below with regard to FIG. 4.

For example, filling in the server code spaces is performed by the server filling in the hash table for an element code space. That is, in step 410, the page number variable is set to 0 and the index variable to 5 (e.g., in the exemplary implementation the first four indexes are reserved for global tokens).

For each element declaration (step 415), the server system gets the element name, adds it in the hash table with the element name as the key and (256×pageNumber+index) as the value (step 420). Then, the system increments the index by 1 (step 425). The size of a page for elements is 64 because the last two bits of the index are reserved so that when the index reaches the value 64 ("YES" in step 430), the system increments the page number by 1 and resets the index to 5 (step 435). When the page number reaches its maximum value 255, an exception is raised such that an error message is displayed.

For the attribute code space, for each element declared, the server system obtains the corresponding attribute declaration from the previously built DOM tree (step 440). It adds the attribute name in the hash table with the attribute name as the key and (256×pageNumber+index) as the value (step 445).

If the attribute type is enumerated (e.g., enumerated attribute types are NOTATION or NAME_TOKEN_GROUP) (step 465), then the system looks for the values of this enumerated attribute (step 470). For each value, it adds the attribute value in the hash table with the attribute value as the key and (256×pageNumber+index) as the value (step 475). Then, the system increments the index for the value by 1 (step 480). The size of a page for attribute value is 128 so that when the index reaches the value 128 (step 485), the system increments the page number by 1 and resets the index to 5 (step 490).

When the page number reaches its maximum value 255, an exception is raised. If there are no values or when the values have been successfully added to the attribute value code space, the system increments the index for the name by 1 (step 450). The size of a page for an attribute name is 128 so that when the index reaches the value 128 ("YES" in step 455), the system increments the page number by 1 and resets the index to 5 (step 460). When the page number reaches its maximum value 255, an exception is raised and an error message is displayed.

Finally, returning to FIG. 3A, in step 360, the client code spaces are filled-in. A method 500 for filling in the 2-dimensional array for element code space will be described hereinbelow.

First, in step 510, the page number variable is set to 0 and the index variable to 5 (e.g., the first four indexes are reserved for global tokens). For each element declaration found (step 515), the system obtains the element name, and adds it in the elements array at a predetermined position (e.g., page number, index) (step 520). Then, the system increments the index by 1 (step 525). The size of a page for elements is 64 because the last two bits of the index are reserved so that when the index reaches the value 64 ("YES"

in step 530), the system increments the page number by 1 and resets the index to 5 (step 535). When the page number reaches its maximum value 255, an exception is raised.

For an attribute code space, for each element is declared, the client's system obtains the corresponding attribute declaration from the previously built DOM structure (step 540). Then, the system adds the attribute name in the attribute names array at a predetermined position (page number, index) (step 545). If the attribute type is enumerated (e.g., enumerated attribute types are NOTATION OR NAME_TOPKEN_GROUP) (step 565), then the system checks for the values of this enumerated attribute (step 570).

For each value, it adds the attribute value in the attribute values array at a predetermined position (page number, index) (step 575). This system increments the index for the value by 1 (step 580). The size of a page for an attribute value is 128. Thus, when the index reaches the value 128, the system increments the page number by 1 and resets the index to 5 (step 590). When the page number reaches its maximum value 255, an exception is raised. If there are no values or when the values have been successfully added to the attribute value code space, the system increments the index for the name by 1 (step 550). The size of a page for attribute name is 128 so that when the index reaches the value 128, the system increments the page number by 1 and resets the index to 5 (step 560). When the page number reaches its maximum value 255, an exception is raised.

Improvements to Code Space

Improvement for the attribute code spaces can be provided by merging the attribute names cod space and the attribute values code space into one token. That is, each couple (e.g., attribute name, attribute value) is made into a single token instead of two tokens (e.g., name and value). Thus, if an attribute has 3 possible values, then there will be three different tokens for this attribute.

Figure 6:
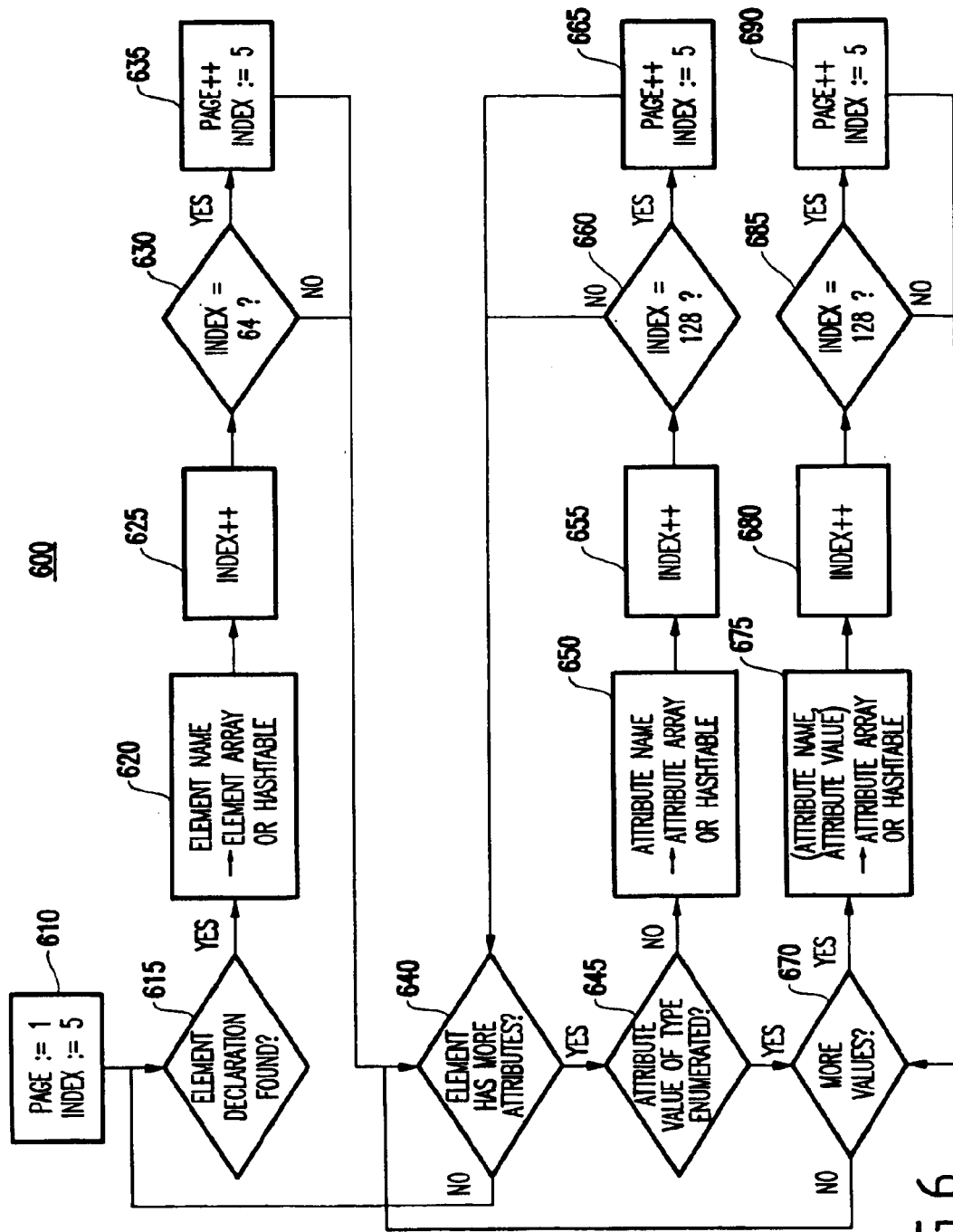
FIG. 6 illustrates a method 600 of filling in an unproved code space according to the invention.

Referring now to FIG. 6, to fill this improved code space, for each element declared, the inventive system gets the corresponding attribute declaration from the previously-built DOM structure. If the attribute-type is not enumerated (e.g., no specific value is declared for this attribute) (a "NO" in step 645), then the system adds the attribute name in the attribute code space (e.g., hash table for the server, array for the client) (step 650).

If the attribute-type is enumerated (a "YES" in step 645), then the system looks for the values of this enumerated attribute (step 670). For each value, it adds the couple (attribute name, attribute value) with a specific token in the attribute code space (step 675).

Thereafter, when the server comes across an attribute with a value, it will look in the attribute code space for the couple (attribute name, attribute value). If the server can find the couple, the server will send this token associated therewith.

If the server cannot find it, the server will look for the attribute name in the attribute code space. If the name is found, the server sends the corresponding token for this name followed by a string inline token followed by the attribute value encoded in the charset specified at the beginning of the inventive stream. If the name is not found, an exception is raised such that an error message is displayed and the process terminates.

Regarding improving the element code space, as mentioned above, some elements can have required or fixed attributes. For these elements, it is unnecessary to transmit tokens for the required or fixed attributes.

In order not to transmit tokens for required or fixed attributes in order to save bandwidth, the inventive system can store in the element code space the names of the required or fixed attributes with the element name. For example, attributes Author and Genre are required for element Book so the element code space stores the triplet (Book, Author, Genre) at the entry Book.

Hereinbelow is described the method used by the inventive system to fill in this element code space. That is, for each element declaration, the system gets the element name from the array on the client side, and the hash table on the server side, and the required and fixed attributes from the array on the client side, and the hash table on the server side. It adds the element names and the required and fixed attribute names to the element code space. For the fixed attributes, it also adds their value. Thus, the system knows which attributes are fixed. In the attribute code space, only the implied attributes will be stored with their value if defined as described above.

Hereinbelow is provided some exemplary code of the present invention.

```
*@param dtd a <code>DTD</code> object
*/
private void build(DTD dtd)
throws CodespaceException {
System.outprintIn("Processing OTO
// Read elements names
Enumeration elementDecl = dtd.getElementDeclarations( );
int pageTag = 0, indexTag = 5, pageAtt = 0, indexAtt = 5;
while (elementDecl.hasMoreElements( )) {
    String tagName = ((ElementDecl)(elementDecl.nextElement( ))).getName( );
    tagNames.put(tagName, new Integer(256*pageTag+indexTag));
    if((++indexTag)= =TAG_PAGE_SIZE) {
        if((++pageTag) = =SPACE_SIZE) throw new CodeSpaceException("Too many tags");
        indexTag=5;
    }
// Read attributes names and values
Enumeration attDefs = dtd.getAttributeDeclarations(tagName);
while (attDefs.hasMoreElements( )) {
    AttDef attDef = (AtDef)(attDefs.nextElement( ));
    String attName = attDef.getName( );
    if ((attDef.getDeclaredType( )= =AtDef.NAME_TOKEN_GROUP)II
        (attDef.getDeclaredType( )= =AttDef.NOTATION)) {
        Enumeration enum = attDef.elements( ):
```

-continued

```
                if (enum= =null) {
                    if (!attNames.containsKey(attName)) {//attribute name not yet in
table
                        AttNames.put(attName, new Integer(256*page Att+indexAtt));
//put it
                    if ((++indexAtt)= =ATT_PAGE_SIZE) {
                        if ((++pageAtt) =
=SPACE_SIZE) throw new
CodeSpaceException("Too many attributes");
                            indexAtt = 5;
                        }
                    }
        } else {
            while (enum.hasMoreElements( )) {
String attstart = attName +. "=." + enum.nextElement( ):
if (!attNames.containsKey(attStart)) {attNames.put(attstart, new
if ((++indesAtt)= =ATT PAGE_SIZE) {
if ((++pageAtt)= =SPACE_SIZE) throw new CodespaceException("Too many attributes");
indexATT = 5;
                }
            }
        }
    }
}else{
if (!attNames.containsKey(attName)) {//attribute name not yet in table
attNames.put(attName, new Integer(256*pagMt+indeXAn)); // put it
if ((++indexAtt)= =ATT_PAGE_SIZE) {
if ((++pageAtt)= =SPACE_SIZE) throw new CodeSpaceException("Too many attributes");
                    indexAtt = 5;
                }
            }
        }
    }
}
```

Figure 7:
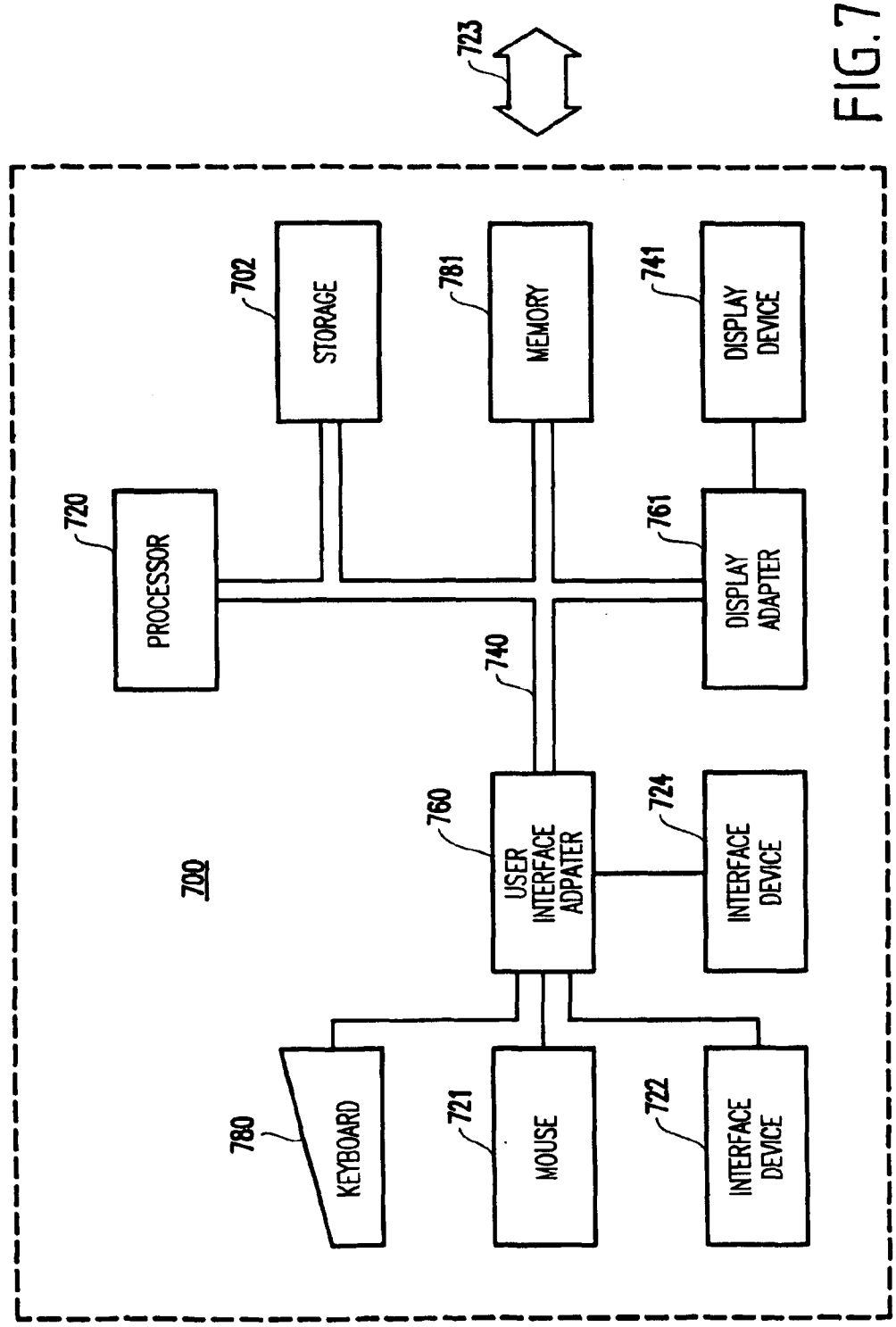
FIG. 7 illustrates an exemplary information handling/computer workstation 700 for use with the invention.

FIG. 7 illustrates a representative workstation hardware environment in which the present invention may be practiced. The environment of FIG. 7 comprises a representative single user computer workstation 700, such as a personal computer, including related peripheral devices. The workstation 700 includes a microprocessor 720 and a bus 740 employed to connect and enable communication between the microprocessor 720 and the components of the workstation 700 in accordance with known techniques. The workstation 700 typically includes a user interface adapter 760, which connects the microprocessor 720 via the bus 740 to one or more interface devices, such as a keyboard 780, mouse 721, and/or other interface devices 722, which can be any user interface device, such as a touch sensitive screen, digitized entry pad, etc. The bus 740 also connects a display device 741, such as an LCD screen or monitor, to the microprocessor 720 via a display adapter 761. The bus 740 also connects the microprocessor 720 to memory 781 and long-term storage 702 which can include a hard drive, diskette drive, tape drive, etc.

The workstation 700 may communicate with other computer or networks of computers, for example via a communication channel or modem 723. Alternatively, the workstation 700 may communicate using a wireless interface at 724, such as a CDPD (cellular digital packet data) card. The workstation 700 may be associated with such other components in a local area network (LAN) or a wide area network (WAN), or the workstation 700 can be a client in a client/server arrangement with another computer, etc. All of these configurations, as well as the appropriate communications hardware and software, are known in the art.

Figures 8, 9:
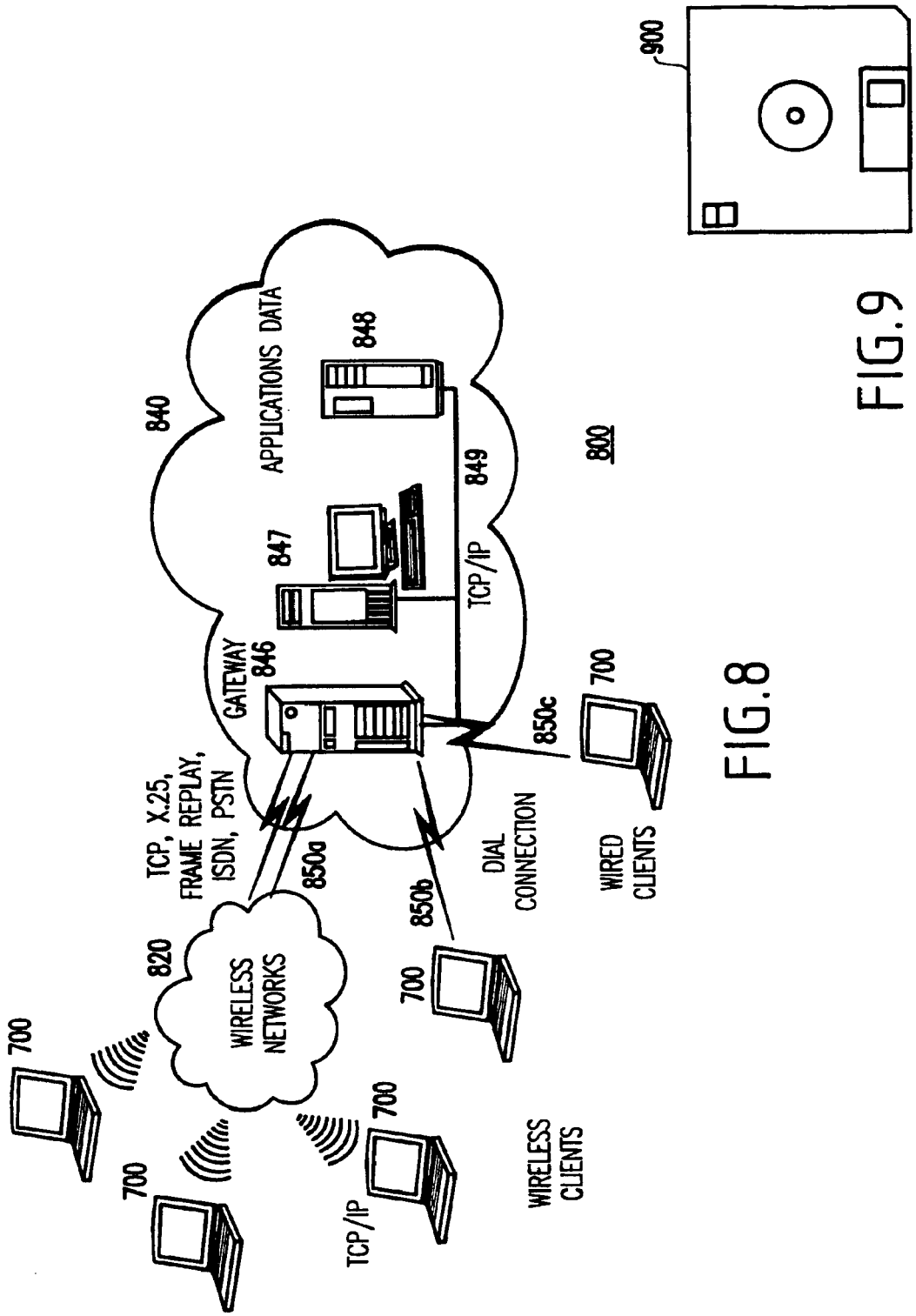
FIG. 8 illustrates an exemplary data processing network for use with the invention.
FIG. 9 illustrates a medium 800 for storing a program for implementing the method according to the present invention.

FIG. 8 illustrates a data processing network 800 in which the present invention may be practiced. The data processing network 800 may include a plurality of individual networks, such as wireless network 820 and network 840, each of which may include a plurality of individual workstations 700. Additionally, as those skilled in the art will appreciate, one or more LANs may be included (not shown), where a LAN may comprise a plurality 6f intelligent workstations coupled to a host processor.

Still referring to FIG. 8, the networks 820 and 840 may also include mainframe computers or servers, such as a gateway computer 846 or application server 847 (which may access a data repository 848). A gateway computer 846 serves as a point of entry into each network 840. The gateway 846 may be preferably coupled to another network 820 by means of a communications link 850a. The gateway 846 may also be directly coupled to one or more workstations 700 using a communications link 850b, 850c. The gateway computer 846 may be implemented utilizing an Enterprise Systems Architecture/380 available from the International Business Machines Corporation ("IBM"), an Enterprise Systems Architecture/390 computer, etc. Depending on the application, a midrange computer, such as an Application System/400 (also known as an AS/400) may be employed ("Enterprise Systems Architecture/370" is a trademark of IBM; "Enterprise Systems Architecture/390", "Application System/400", and "AS/400" are registered trademarks of IBM.)

The gateway computer 846 may also be coupled 849 to a storage device (such as data Repository 848). Further, the gateway 846 may be directly or indirectly coupled to one or more workstations 700.

Those skilled in the art will appreciate that the gateway computer 846 may be located a great geographic distance from the network 820, and similarly, the workstations 700 may be located a substantial distance from the networks 820 and 840. For example, the network 820 may be located in California, while the gateway 846 may be located in Texas, and one or more of the workstations 700 may be located in New York. The workstations 700 may connect to the wireless network 820 using a network protocol such as the Transmission Control Protocol/internet Protocol ("TCP/IP") over a number of alternative connection media, such as cellular phone, radio frequency networks, satellite networks, etc. The wireless network 820 preferably connects to the gateway 846 using a network connection 850a such as TCP or UDP (User Datagram Protocol) over IP, X.25, Frame Relay, ISDN (Integrated Services Digital Network), PSTN (Public Switched Telephone Network), etc. The workstations 700 may alternatively connect directly to the gateway 846 using dial connections 850b or 850c. Further, the wireless network 802 and network 840 may connect to one or more other networks (not shown), in an analogous manner to that depicted in FIG. 8.

Software programming code which embodies the present invention is typically accessed by the microprocessor 720 of the workstation 700 and server 847 from long-term storage media 702 of some type, such as a CD-ROM drive or hard drive. The software programming code may be embodied on any of a variety of known media for use with a data processing system, such as a diskette, hard drive, or CD-ROM. The code may be distributed on such media, or may be distributed to users from the memory or storage of one computer system over a network of some type to other computer systems for use by users of such other systems. Alternatively, the programming code may be embodied in the memory 848, and accessed by the microprocessor 720 using the bus 740. The techniques and methods for embodying software programming code in memory, on physical media, and/or distributing software code via networks are well known and will not be further discussed herein.

A user of the present invention may connect his computer to a server using a wireless connection, or a wireless connection. Wireline connections are those that use physical media such as cables and telephone lines, whereas wireless connections use media such as satellite links, radio frequency waves, and infrared waves. Many connection techniques can be used with these various media, such as: using the computer's modem to establish a connection over a telephone line; using a LAN card such as Token Ring or Ethernet; using a cellular modem to establish a wireless connection, etc. The user's computer may be any type of computer processor, including laptop, handheld or mobile computers; vehicle-mounted devices; desktop computer; mainframe computers; etc., having processing (and optionally communication) capabilities. The remote server, similarly, can be only of any number of different types of computer which have processing and communication capabilities. These techniques are well known in the art, and the hardware devices and software which enable their use are readily available. The user's computer will be referred to eqivalently as a "workstation", "device", or "computer", and use of any of these terms or the term "server" refers to any of the types of computing devices described above.

In the preferred embodiment, the present invention is implemented as one or more computer software programs. The implementation of the software for schema—driven compressed of XML or DOM files may be operate on a server in a network, as one or more modules (also referred to as code subroutines, or "objects" in object-oriented programming) which are invoked upon request. Alternatively, the software may operate on a user's workstation. The logic implementing the invention may be integrated with the code of a program which creates the XML files or it may be implemented as one or more separate utility modules, without deviating from the inventive concepts disclosed herein. The server may be functioning as a Web server, where the Web server provides services in response to requests from a client connected through the Internet. Alternatively, the server may be in a corporate intranet or extranet of which the client's workstation is a component, or in any other network environment. While the preferred embodiment anticipates that the compressed files are sent over a network connection, the file content may also be transferred between computers via a storage media (such as diskette), without deviating from the inventive concepts disclosed herein.

In addition to the hardware/software environment described above, a different aspect of the invention includes a computer-implemented method for performing the above method.

Such a method may be implemented, for example, by operating a computer, as embodied by a digital data processing apparatus, to execute a sequence of machine-readable instructions. These instructions may reside in various types of signal-bearing media.

The signal-bearing media may include, for example, a RAM contained within the CPU/processor, as represented by the fast-access storage for example. Alternatively, the instructions may be contained in another signal-bearing media, such as a magnetic data storage diskette 900 (FIG. 9), directly or indirectly accessible by the CPU.

Whether contained in the diskette 900, the computer/CPU, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

With the unique and unobvious features of the present invention, hence, the present invention not only takes advantage of the separation of the structure and data of an XML document, but it also takes advantage of the associated DTD (schema) of the document to perform optimization. The DTD schema describes the constraints on the structures, possible values, and occurrence restrictions of attribute values and elements. The compression algorithm, once it knows that there is a schema associated with the document, takes advantage of this and produces further compression of the data.

Further, the present invention provides an efficient compression algorithm for XML documents in which the XML documents are compressed, and such that the structural information will be kept in the compressed form so that the documents can be easily reconstructed. The invention provides a lossless compression algorithm that gets as close as possible to the ZLIB algorithm. Hence, with the invention, the markup (structure) and non-markup (data) can be separated, and the non-markup component can be compressed using ZLIB and the markup component can be compressed using binary encoding.

Thus, with the unique and unobvious aspects of the present invention, the schema information (the DTD associated with the document) can be used to compress the structure component and obtain higher compression rate while simultaneously retaining the structure.

While the invention has been described in terms of a preferred embodiment, those skilled in the art will recognize that the invention can be practiced with modifications within the spirit and scope of the appended claims.

Having thus described our invention, what we claim as new and describe to secure by Letters Patent is as follows:

1. A method of compressing an extensible markup language (XML) document, comprising:
   compressing an XML document and its associated schema information such that information is a markup portion therein is maintained in a compressed form to allow the document to be reconstructed;
   wherein, during said compressing, said markup portion and a non-markup portion of said document are separated, and the non-markup portion is compressed using a first compression method and the markup portion is compressed using a second compression method;
   wherein said mark-up portion comprises structured component information; and
   wherein said schema information associated with the document is used with compressing the structure component to obtain a predetermined compression rate while simultaneously retaining the structure.

2. The method according to claim 1, wherein said predetermined compression rate comprises a higher compression rate than a compression rate in which said schema information associated with the document is not used with compressing the structure component.

3. The method according to claim 2, wherein said schema information comprises a document type definition (DTD).

4. The method according to claim 1, wherein said markup portion comprises a structure of the document and said non-markup portion comprises data associated with said document.

5. The method according to claim 1, wherein said XML document includes elements containing at least one of character data, child elements, and a combination of character data and child elements.

6. The method according to claim 1, wherein an XML markup language is defined in a Document Definition (DTD),
   wherein said DTD is contained in at least one of a <!DOCTYPE> tag and an external file, and referenced from a <!DOCTYPE> tag.

7. The method according to claim 1, wherein an element comprises a group of one or more subelements, character data, EMPTY, or ANY, and
   wherein attributes are one of optional, required, and selectively include a fixed value, and wherein optional attributes include a default and fixed attributes always have a default.

8. The method according to claim 6, wherein prior to compressing, a tag name token is associated with each tag name, an attribute name token is associated with each attribute name and an attribute value token is associated with each attribute value which is defined in the DTD.

9. The method according to claim 8, wherein a server searches for the token corresponding to an element or an attribute.

10. The method according to claim 9, wherein a client searches for the element or attribute corresponding to a particular token.

11. The method according to claim 10, wherein the server and the client each use a different data structure.

12. The method according to claim 1, wherein said compressing further comprises:
   creating the data structure on a server and on a client.

13. The method according to claim 12, wherein said compressing further comprises:
   parsing a document type definition (DTD) of the XML document.

14. The method according to claim 13, wherein said compressing further comprises:
   filling in server code spaces.

15. The method according to claim 14, wherein said compressing further comprises:
   filling in client code spaces.

16. The method according to claim 14, wherein, for a specific tag name or attribute name or value, the server finds a corresponding token.

17. The method according to claim 16, wherein a hash table is used for storing a key and a value as a couple where the key is a string and the value is a corresponding token.

18. The method according to claim 17, wherein the client finds the tag name or attribute name or value corresponding to a specific token, and wherein said token is split into a set of overlapping code spaces.

19. The method according to claim 18, wherein said client is provided with a page number and an index in a code space page, and finds the corresponding string and wherein each code space includes a two-dimensional array indexed by page numbers and indexes in pages.

20. The method according to claim 14, wherein the DTD is parsed using a document object model (DOM) parser which generates a DOM structure for the DTD, for allowing accessing elements declarations and attributes declarations with name and type and attributes values when an attribute type is enumerated.

21. The method according to claim 14, wherein server code spaces are filled-in by filling in a hash table for an element code space such that a page number variable is set to a first predetermined value and the index variable is set to a second predetermined value.

22. The method according to claim 21, wherein, for each element declaration, an element name is added to the hash table with the element name as the key and (256×pageNumber+index) as the value,
   wherein the index is incremented by 1 and a size of a page for elements is a predetermined number and when the index reaches the predetermined number, the page number is incremented by 1 and the index is rest, and
   wherein when the page number reaches a maximum value, an exception is raised.

23. The method according to claim 22, wherein for the attribute code space, for each element declared, a corresponding attribute declaration is obtained from a previously built Document Object Model (DOM) tree, and adds the attribute name in the hash table with the attribute name as the key and (256×pageNumber+index) as the value.

24. The method according to claim 23, wherein, if the attribute type is enumerated, then the values of the enumerated attribute are searched,
   for each value, the attribute value is added in the hash table with the attribute value as the key and (256×pageNumber+index) as the value, and the index for the value is incremented,
   wherein a size of a page for an attribute value is a predetermined number such that when the index reaches the predetermined number, the system increments the page number and resets the index, and
   wherein, when the page number reaches its maximum value, an exception is raised, wherein, if there is no values or when the values have been successfully added to the attribute value code space, then the index is incremented for the name, wherein the size of a page for an attribute name is a predetermined number and such that when the index reaches the page number is incremented and the index is reset, and when the page number reaches its maximum value, an exception is raised.

25. The method according to claim 22, wherein the filling-in of the client code spaces includes:

setting the page number variable to a first predetermined number and the index variable to a second predetermined number, for each element declaration, obtaining the element name, adding it in the elements array at a predetermined position indicating (page number, index) and incrementing the index.

26. The method according to claim 25, wherein for an attribute code space, for each element declared, obtaining the corresponding attribute declaration from a previously built DOM structure, adding the attribute name in the attribute names array at a predetermined position represented by a couple formed of (page number, index).

27. The method according to claim 26, wherein if the attribute type is enumerated, then checking for the values of this enumerated attribute, and for each value, adding the attribute value in the attribute values array at a predetermined position (page number, index) and incrementing the index for the value, wherein when the index reaches a predetermined value, incrementing the page number and resetting the index to a predetermined number, and when the page number reaches a maximum value, raising an exception.

28. The method according to claim 27, wherein if there are no values or when the values have been added to the attribute value code space, incrementing the index for the name, and wherein when the size of a page for attribute name is a predetermined number, incrementing the page number to a predetermined number and resetting the index to a predetermined number, and when the page number reaches a maximum value, raising an exception.

29. The method according to claim 1, further comprising:

merging an attribute names code space and an attribute values code space into one token.

30. The method according to claim 1, wherein each couple formed by (attribute name, attribute value) is made into a single token.

31. The method according to claim 30, wherein, for each element declared, a corresponding attribute declaration is obtained, and wherein if an attribute-type is not enumerated by having a specific value declared for this attribute, then adding the attribute name in the attribute code space.

32. The method according to claim 31, wherein the attribute code space comprises a has table for a server, and an array for a client.

33. The method according to claim 31, wherein if the attribute-type is enumerated, then values are searched for the enumerated attribute, and for each value, the couple (attribute name, attribute value) is added with a specific token in the attribute code space.

34. The method according to claim 33, wherein, when the server encounters an attribute with a value, the server searches the attribute code space for the couple (attribute name, attribute value), and if the server finds the couple, the server sends the token associated therewith.

35. The method according to claim 34, wherein if the server cannot find the couple, the server looks for the attribute name in the attribute code space, and wherein, if the name is found, the server sends the corresponding token for the name followed by a string inline token followed by the attribute value encoded in a charset specified at a beginning of the XML document stream.

36. The method according to claim 21, wherein the element code space includes elements selectively having required or fixed attributes, and wherein, for said elements having the required or fixed attributes tokens are not transmitted, wherein the names of the required or fixed attributes with the element name are stored in the element code space.

37. The method according to claim 36, wherein to fill in the element code space, for each element declaration, the element name and required and fixed attributes are obtained, and wherein the element names and the required and fixed attribute names are added to the element code space, and for the fixed attributes, a value thereof is added additionally.

38. The method according to claim 37, wherein, in the attribute code space, only implied attributes are stored with their value if defined.

39. The method according to claim 1, wherein said first compression method comprises a lossless data compression method.

40. The method according to claim 39, wherein said second compression method comprises a binary encoding method.

41. A system for compressing an extensible markup language (XML) document, comprising:

means for compressing an XML document such that information comprising a markup portion therein is maintained in a compressed form to allow the document to be reconstructed; and means, during compressing, for separating said markup portion and a non-markup portion of said document, wherein said compressing means compresses the non-markup portion using a first compression method and compresses the markup portion using a second compression method, wherein said mark-up portion comprises structured component information, and wherein schema information associated with the document is used with compressing the structure component to obtain a predetermined compression rate while simultaneously retaining the structure.

42. A programmable storage medium tangibly embodying a program of machine-readable instructions executable by a digital processing apparatus to perform compressing of an extensible markup language (XML) document, said method comprising:

compressing an XML document such that information comprising a markup portion therein is maintained in a compressed form to allow the document to be reconstructed, wherein, during said compressing, said markup portion and a non-markup portion of said document are separated, and the non-markup portion is compressed using a first compression method and the markup portion is compressed using a second compression method, wherein said mark-up portion comprises structured component information, and wherein schema information associated with the document is used with compressing the structure component to obtain a predetermined compression rate while simultaneously retaining the structure.

* * * * *